(12) United States Patent
Gao

(10) Patent No.: US 11,920,867 B2
(45) Date of Patent: Mar. 5, 2024

(54) HIGHLY MODULARIZED COOLING SYSTEM DESIGN

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 549 days.

(21) Appl. No.: 17/003,488

(22) Filed: Aug. 26, 2020

(65) Prior Publication Data

US 2022/0065537 A1 Mar. 3, 2022

(51) Int. Cl.
| | |
|---|---|
| *F28B 7/00* | (2006.01) |
| *F28B 1/06* | (2006.01) |
| *F28F 25/10* | (2006.01) |
| *F28F 27/00* | (2006.01) |
| *H05K 7/20* | (2006.01) |

(52) U.S. Cl.
CPC ............... *F28B 7/00* (2013.01); *F28B 1/06* (2013.01); *F28F 25/10* (2013.01); *F28F 27/003* (2013.01); *H05K 7/20145* (2013.01); *H05K 7/20309* (2013.01); *H05K 7/20318* (2013.01); *H05K 7/20327* (2013.01); *H05K 7/20345* (2013.01); *H05K 7/20718* (2013.01); *H05K 7/208* (2013.01)

(58) Field of Classification Search
CPC ..... F28B 1/06; F28B 7/00; F28F 25/10; F28F 27/003; H05K 7/20145; H05K 7/20309; H05K 7/20318; H05K 7/20327; H05K 7/20345; H05K 7/20718; H05K 7/208

USPC ............................ 261/136, 138, 140.1, 147
See application file for complete search history.

(56) References Cited

U.S. PATENT DOCUMENTS

| | | | | |
|---|---|---|---|---|
| 3,427,005 A | * | 2/1969 | Kuykendall | F25B 39/04 62/305 |
| 3,963,461 A | * | 6/1976 | Stockford | B01D 47/00 95/227 |
| 4,103,508 A | * | 8/1978 | Apple | F24F 11/30 165/230 |
| 4,538,426 A | * | 9/1985 | Bock | F24F 5/0035 261/151 |

(Continued)

FOREIGN PATENT DOCUMENTS

EP 3 567 996 A1 * 11/2019

*Primary Examiner* — Charles S Bushey
(74) *Attorney, Agent, or Firm* — WOMBLE BOND DICKINSON (US) LLP

(57) ABSTRACT

A modular cooling system for data center. An airflow section forms a duct for air flow and a plurality of core units are serially attached to each other and to the airflow section. A blower unit is attached to each of the core units. A plurality of motorized dampers are provided: between each of the core units and the airflow unit, in between each two core units, and between each core unit and its corresponding blower unit. A plurality of fluid ports are attached to each of the core units. At least one of the core units is loaded with one or more equipment selected from: air filter, humidifier, dehumidifier, heat exchanger, evaporator, condenser, chiller, computer room air conditioner (CRAC), dry cooler, a cooling tower or other types of cooling equipment. A combination operation of the components on the compartment and the cooling units enables fast deployment and operation.

20 Claims, 10 Drawing Sheets

(56) References Cited

U.S. PATENT DOCUMENTS

| | | | | |
|---|---|---|---|---|
| 4,857,090 A | * | 8/1989 | Hartness | F24F 5/0035 |
| | | | | 261/130 |
| 6,338,474 B1 | * | 1/2002 | Semba | H01L 21/67109 |
| | | | | 261/138 |
| 9,591,792 B2 | * | 3/2017 | Carlson | H05K 7/20836 |
| 10,172,261 B2 | * | 1/2019 | Wilcox | H05K 7/1491 |
| 2013/0133350 A1 | * | 5/2013 | Reytblat | H05K 7/2079 |
| | | | | 62/310 |
| 2019/0327861 A1 | * | 10/2019 | Duncan | H05K 7/20836 |

* cited by examiner

HIGHLY MODULARIZED COOLING SYSTEM DESIGN

FIELD OF THE INVENTION

Embodiments of the present invention relate generally to systems for data center cooling. More particularly, embodiments of the invention relate to modular cooling system that may be easily tailored to specific data center cooling requirements.

BACKGROUND

Cooling is a prominent factor in a computer system and data center design. The number of high performance electronic components, such as high performance processors, packaged inside servers has steadily increased, thereby increasing the amount of heat generated and dissipated during the ordinary operations of the servers. The reliability of servers used within a data center decreases if the temperature in the environment in which they operate is permitted to increase over time. Maintaining a proper thermal environment and proper air quality is critical for normal operations of these servers in data centers, as well as the server performance and lifetime. It requires more effective and efficient cooling solutions especially in the cases of cooling high performance servers.

In this document, an active cooling system involves the use of electric energy to cool the air inside the data center. Such systems circulate a coolant to transfer and remove heat from inside the data center. The coolant is either a phase change fluid, e.g., using a refrigeration cycle, or a liquid, e.g., water cooling towers. In either case, some form of heat exchangers are used, which requires application of electrical power to operate the active cooling system. In this respect, a heat exchanger is any device used to transfer heat between two or more fluids.

A system that uses ambient air and/or water from a nearby stream is sometimes referred to as "free cooling" or direct free air cooling. These systems are able to switch between "active" cooling to "free" cooling when the ambient temperature is sufficiently low. The basic concept is that the system shuts off the compressor or other active air cooling equipment, but the pumps and blowers continue to operate and pump outside air—optionally after filtering—directly into the data center. When the outside temperature rises, the system activates the air cooling equipment to provide active air cooling.

Currently, each cooling system is designed and built according to the specification of the particular data center where it will be installed. Each element of the cooling system must be specifically designed and built according to the overall design of the data center. The various elements are then assembled onsite, such that there is no possibility to test the entire system prior to the assembly onsite. Moreover, since different parts of the system may be supplied from different vendors, sometimes the various parts do not properly fit together and need to be modified onsite. Such an approach increases the design and fabrication costs and extends the time it takes to complete and assemble the system.

Also, prior art cooling equipment is designed and built for a specific application and cannot be interchanged or utilized in different applications. Thus, for example, equipment built for a free cooling system may be used only for that system, while equipment (e.g., heat exchanger) built for Indirect Evaporative Cooling (IDEC) can only be installed in that particular system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
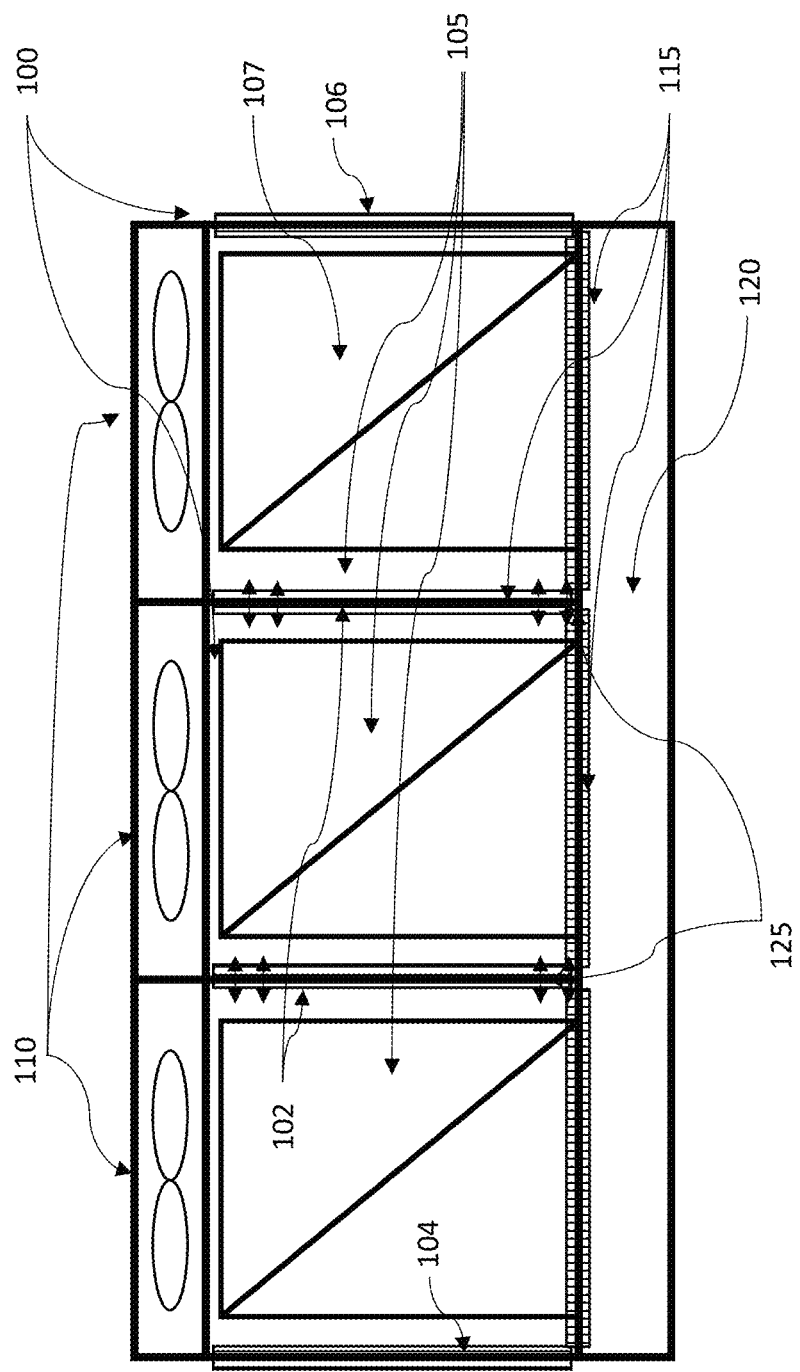
FIG. 1 is a schematic illustrating an example of a modular cooling architecture, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current disclosure provides a highly modularized design for cooling system for data centers. The solution improves the data center design build and deployment efficiency, while providing high level of flexibilities for designing a cooling system.

The disclosed embodiments can be used for configuring different types of cooling systems, whether active or free, including free air cooling, indirect evaporative cooling, chilled water system, cooling water system, as well as any other types for operating liquid cooling data centers and air cooling data centers.

Disclosed aspects also provide highly standardized design for majority of the structure of a cooling system. This means that a tremendous amount of effort is saved for designing, building and deploying a cooling system. The only procedure is to identify the proper equipment to be loaded onto the core units and assemble the modular parts into the system.

Additionally, disclosed embodiments make it very convenient to upgrade the system if the capacity needs to be increased or changed. The lifetime of a cooling system are much longer than the server and IT equipment. Therefore, the current design enables easy upgrade of the cooling system, avoiding the need for reengineering and drastic modification of the cooling system. Such an upgrade process is much less disruptive for the operation of the data center.

According to disclosed aspects of the modular design for cooling system, individual compartment for assembling cooling units are arranged together to build a full cooling system. Fan sections are used for moving the air, while air channels are attached to the structure primarily for data center internal air recirculation. The compartments are equipped with standardized fluid connections, which can be used for connecting different cooling unit fluid loops, supply and return. Dampers are used for defining airflow paths or blocking airflow in different configurations, avoiding the need to fabricating bespoke ducting. The entire structure is a highly modularized, including each of the individual components as well as the whole system. Different types of cooling schemes can be easily designed and assembled, making it highly productized design with no or minimum engineering construction work onsite needed. The complete system can be easily installed, mostly plug and play, and can be flexibly modified based on changing needs.

Aspects of this disclosure include a modular cooling system for data center, comprising: an airflow section forming a duct for air flow; a plurality of core units serially attached to each other and to the airflow section; a plurality of blower units, each blower unit or a set of blowers attached to one of the core units; a plurality of motorized dampers provided: between each of the core units and the airflow unit, in between each two core units, and between each core unit and its corresponding blower unit; a plurality of fluid ports attached to each of the core units; and wherein at least one of the core units is loaded with one or more equipment selected from, but not limited to the following: air filter, humidifier, dehumidifier, heat exchanger, evaporator, condenser, chiller, computer room air conditioner (CRAC), dry cooler, water system, water spraying system and a cooling tower.

According to other aspects, a method for assembling a cooling system for data center is provided, comprising: attaching a plurality of core units to an airflow section in a linear row, the airflow section forming a duct for air flow; attaching a plurality of blower units, one blower unit to each of the core units; attaching a plurality of fluid ports to each of the core units; attaching a plurality of motorized dampers: between each of the core units and the airflow unit, in between each two core units, and between each core unit and its corresponding blower unit; loading at least one of the core units with equipment selected from but not limited to: air filter, humidifier, dehumidifier, heat exchanger, evaporator, condenser, chiller, computer room air conditioner (CRAC), dry cooler, water system, water spraying system and a cooling tower. It needs to be mentioned that other types of cooling units or cooling components can be assembled or installed to the compartment.

FIG. 1 is a schematic illustrating an example of a modular cooling system, according to one embodiment. FIG. 1 introduces the general modularity concept and will be followed by specific examples of implementing different cooling systems using this modularity concept. According to this embodiment, the system is constructed using several cooling modules 100, here three are shown, but any number may be used. Each module 100 is fully assembled at the factory and as many modules as needed may be connected together to form the complete system, so that no custom fabrication is needed for each data center. The equipment installed inside each module 100 may be different, but since it is assembled in the factory, the entire system arrives at the site ready for service after installation in the data center.

Each of the cooling modules 100 has independent housing structure with provisions for attachment to other housings, and includes the following components: core section 105 (also referred to as the cooling equipment compartment section), cooling air blower section 110, damper section 115, airflow section 120 and fluid loops with standardized ports 125. In the core section 105, different type of cooling units or equipment 107 can be assembled, such as air to air heat exchanger, liquid to air heat exchanger, chiller, DX (Direct expansion) unit, dry cooling, water spraying system, CRAH (Computer Room Air Handler) unit, CRAC (Computer Room Air Conditioner) unit, and so on. By loading the core section 105 with different equipment, the cooling module is transformed from a generic unit into a bespoke unit to provide specific function required for the system as a whole. Also, as will be demonstrated below, in some systems some of the core sections 105 may simply remain empty, but can still be used as part of the air path.

The blower sections 110 are equipped with blowers for moving external or ambient airflow, and each may operate individually as air inlet (blowing air into the system) or air outlet (blowing air out of the system). This may be implemented either by blowers equipped with motors and vanes that may move air in either direction, or by designing as a modular section which enables easy replacement between blowers moving air in one direction and blowers moving air in the opposite direction. In some situations, one or more of the blowers may remain idle or inactive.

Damper sections 115 are used to form and create airflow paths by activating each damper individually as needed. Using the damper sections to create different flow paths avoids the need to design and fabricate specific ducting for each application. Here the dampers may assume variable opening positions, so as to control the amount of air flow through each of the dampers. The airflow section 120 is used for either receiving data center airflow or discharging airflow to the data center or IT region. The fluid loops 125 are used to connect the equipment if fluid connections are needed between or among the equipment. The fluid loops 125 include standard ports in each cooling module 100. In this way, if the equipment loaded into a core section 105 needs fluid circulation, it can be easily connected to the standard ports. Also, the standard ports enable sharing of fluid flow among different cooling modules 100. While generally each compartment is fabricated with the fluid ports, the fluid ports can be assembled and disassembled from the compartment as needed.

In some embodiments, the housing of all the cooling modules 100 have the same dimensions and same form factor. On the other hand, specific interfaces may be attached to each cooling module 100 depending on its position or use in the system. For example, a middle cooling unit would need connecting interfaces 102 on both sides so as to connect to abutting cooling units, while an end unit would need a terminating interface 104 on only one side and connecting interface 102 on the opposite side. Similarly, a cooling unit attached to an IT container or data center would need one connecting interface 102 to connect to another cooling unit and one facility interface 106 to connect to the IT container or data center. In some embodiments, the connecting interfaces 102 include the fluid ports, while the terminating interface 104 would not include the fluid ports. The facility interface 106 may include fluid ports for delivering cooling fluids, e.g., chilled water, to the facility.

The following systems are configured by the modular parts, which are assembled to configure different styles of cooling systems to satisfy particular requirements. Basically, there are two key procedures for configuring a system using the cooling framework: 1. Assemble cooling units to the cooling compartments; and 2. Adjusting the working conditions of the components such as dampers/louvers, fluid ports, fans on the compartments.

Figure 2:
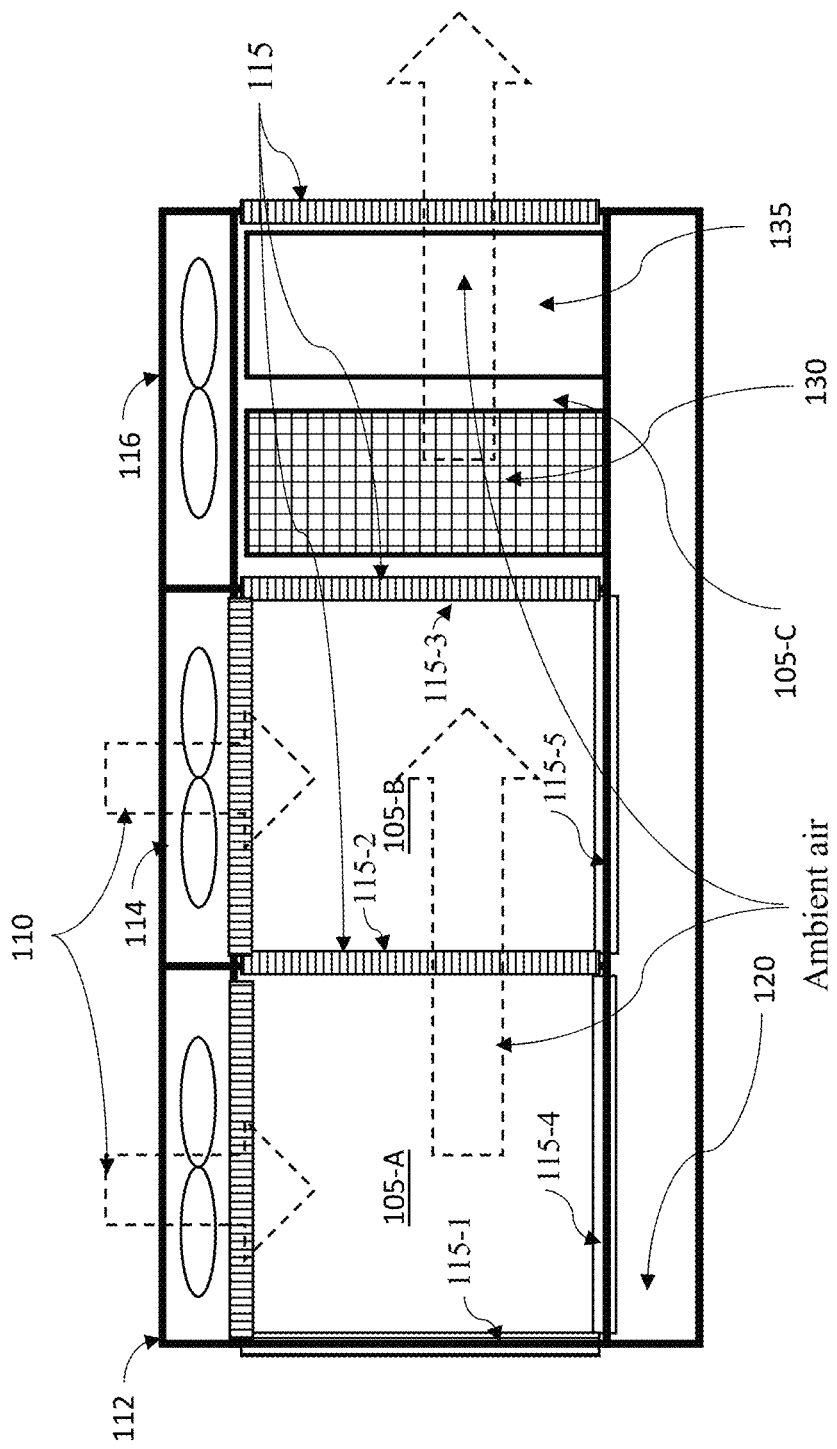
FIG. 2 is a schematic illustrating an example of a free cooling system, according to one embodiment.

FIG. 2 illustrates an example of a system implementing a free air cooling design. Again, three modules 100 are used to illustrate the concepts and features, but any number of units may be used to form the complete system. The core sections 105-A and 105-B of the first two modules are basically empty, but form part of the air flow path. The third core section 105-C may be fitted with optional mechanical or chemical filters 130 and/or dehumidifier/humidifier 135, depending on the anticipated ambient air quality. In this example, the ambient air (e.g., atmospheric air from outside the data center facility) is directly pumped into the building and is supplied to the load to remove heat. The ambient air is blown into the system by blower 112, blower 114, or both blowers 112 and 114 as needed, and is directed into the building through the core section 105-C, as illustrated by the broken-line arrows. The motorized dampers 115 are operated to assume a position forming the air delivery path illustrated by the broken-line arrows. Hatched blocks indicate open dampers while no hatches indicate closed dampers. For example, louver 115-1, if equipped, assumed a closed position, as well as louvers 115-4 and 115-5. Conversely, louvers 115, 115-2 and 115-3 are opened to allow air flow through both core sections 105-A and 105-B to 105-C. Note also that in this configuration blower 116 and airflow section 120 are inactive. Further, in this configuration the hot air outlet is formed by other ducting in the data center, which is not shown in FIG. 2, as it does not form part of this system.

Figure 3:
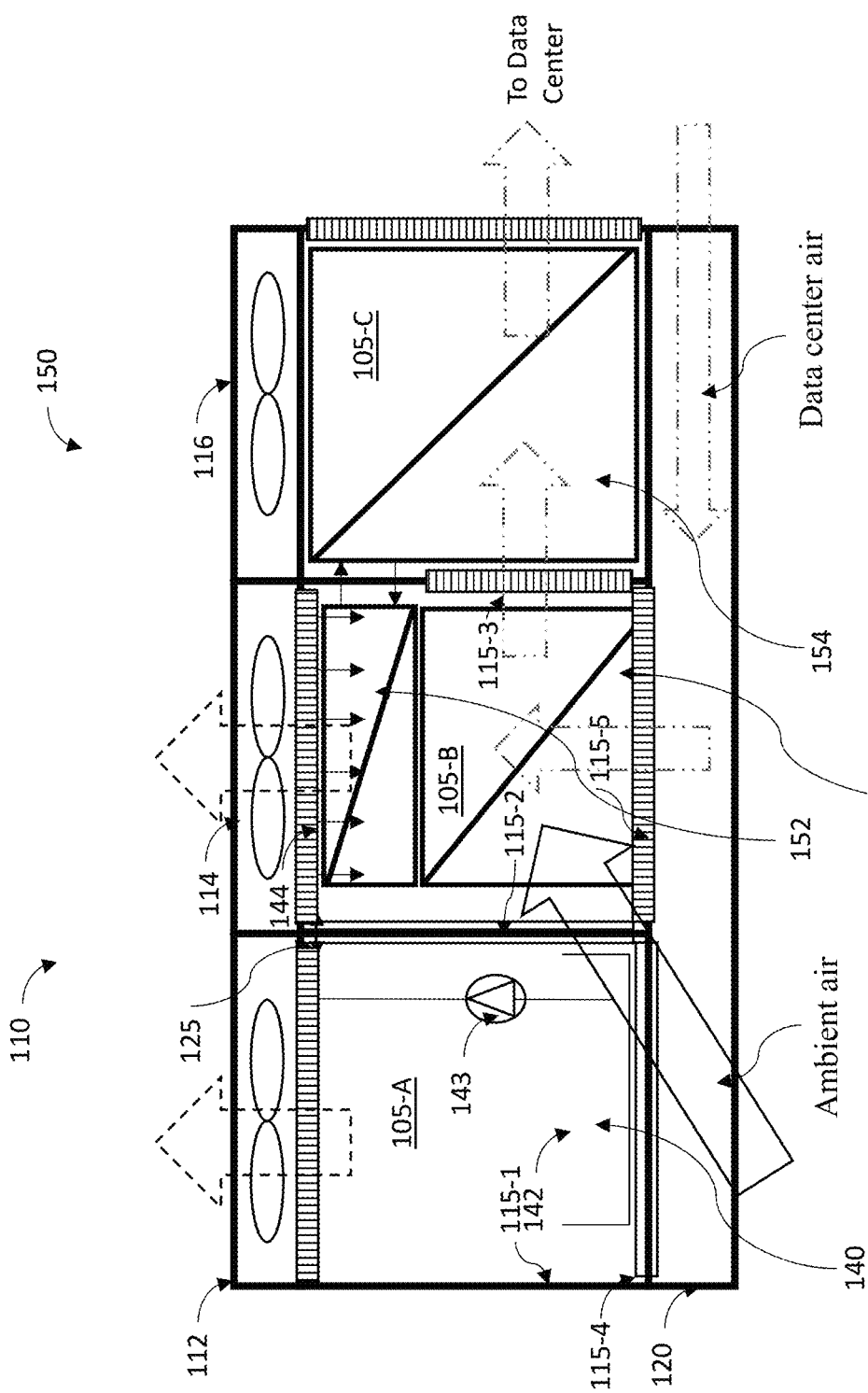
FIG. 3 is a schematic illustrating an example of indirect evaporative cooling system, according to one embodiment.

As another configuration, FIG. 3 shows an Indirect Evaporative Cooling (IDEC) system assembled using the current modular design. The first core section 105-A is equipped with a water spraying system 140 for wet cooling mode. The water system 140 includes a water reservoir 142, a water pump 143 and water spray 144. In this implementation the reservoir 142 and pump 143 are provided in the first section 105-A, and are connected using the standard ports 125 to the water spray 144, which is installed in the second section 105-B.

The middle core section 105-B is equipped with the air to air heat exchanger 145 and a DX (direct expansion) system 150 is assembled partly in the second core section 105-B (e.g., condenser 152) and partly in the third core section 105-C (e.g., evaporator 154). The blower unit 112 is used to evacuate hot air to the ambient, while blower 114 may be used for flowing air to cool the air-to-air heat exchanger 145 and the condenser 152. The airflow section 120 is fitted to collect hot air from the data center and direct it to the air-to-air heat exchanger 145. Also, ambient air is flown through the air-to-air heat exchanger 145 to remove heat from the data center air. The flow paths of air passing through different modules are regulated using motorized dampers 115, wherein hash marks indicate an open position and no hash marks indicate closed position. As shown in FIG. 3, louvers 115-1, 115-2, and 115-4 are closed, while louvers 115-3 and 115-5 are open.

Note that the inlet port for the ambient air of the middle core section 105-B is in a third dimension (into the page), so that it is shown simply by the slanted solid-line arrow. This means the outside air is delivered into the middle core section 105-B though the side. Also, in this embodiment the ambient air is not flown into the data center, but rather is only used as transfer medium in the air-to-air heat exchanger and is then evacuated to the atmosphere by blowers 114 and/or 112. Blower 116 is idle in this configuration. It needs to be mentioned that the corresponding sealing design for the unit with the compartment can be either using structures attached on the cooling unit or added as a separate unit. The sealing design involves assembling the cooling unit, such as a exchanger to the cooling compartment, while ensuring that airflow entering the damper/louver is prevented from leaking and that external air is prevented from mixing with the internal recirculating airstream.

Figure 4:
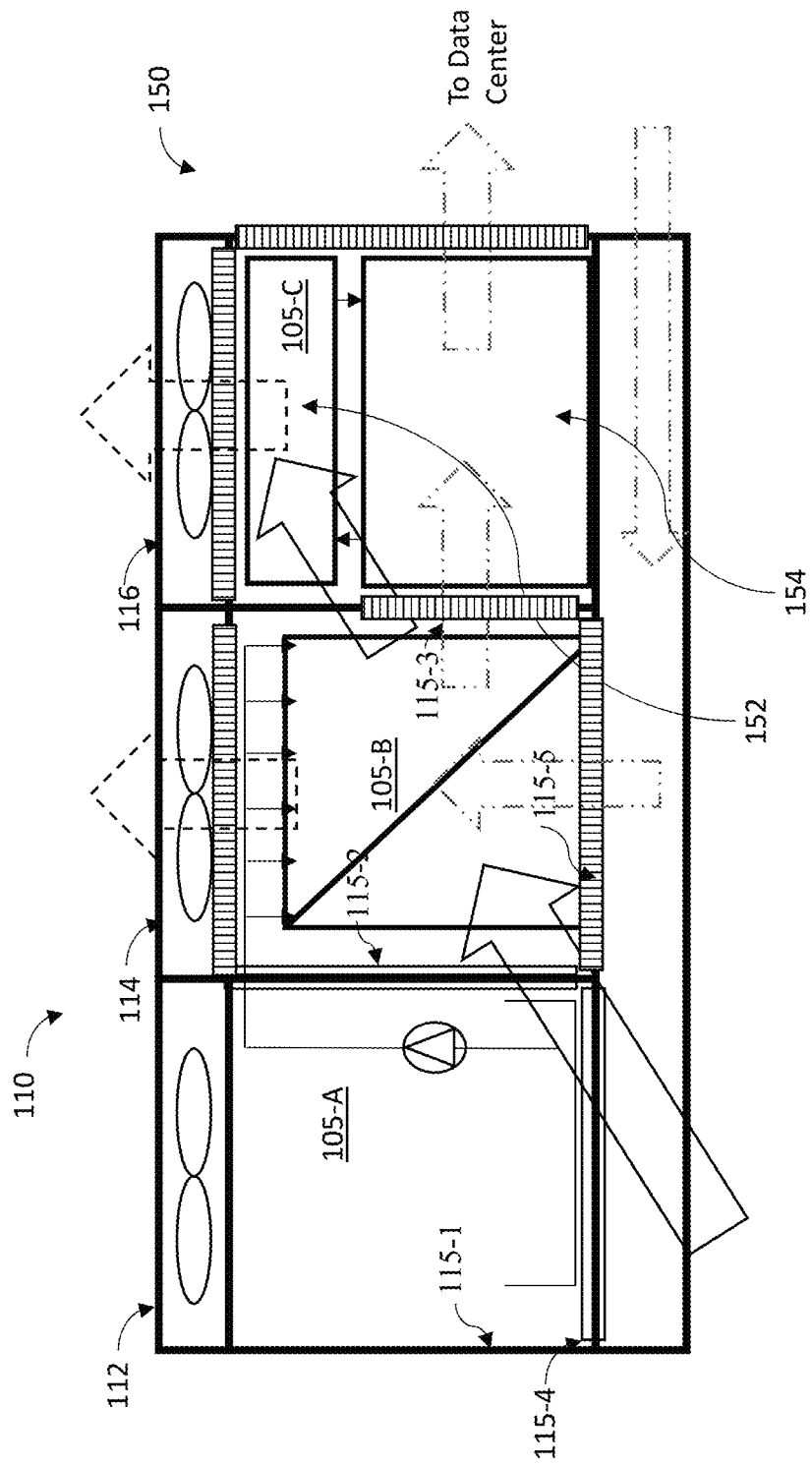
FIG. 4 is a schematic illustrating another example of indirect evaporative cooling system, respectively, according to one embodiment.

In the example of FIG. 3 the DX system is split between two modules 105-B and 105-C, but this is not mandatory. For example, FIG. 4 illustrates another configuration of an IDEC wherein the entire DX system is assembled in the third module 105-C. In this case the blower 116 on the top of the third unit 100 is used to flow air in the DX system, while blower 112 idles. Compared with the design shown in FIG. 3, using the same equipment but rearranging it as in FIG. 4 can deliver higher cooling capacity. As before, the inlet port for the ambient air is in a third dimension (into the page), so that it is shown simply by the slanted solid-line arrow. This representation is repeated in other Figures. Also, some figures show louvers between a blower unit and a core compartment; however, it is not mandatory to have such louvers. Some fans and/or blower arrangements do not permit air flow when not activated and, therefore, can be installed without louvers.

Figure 5:
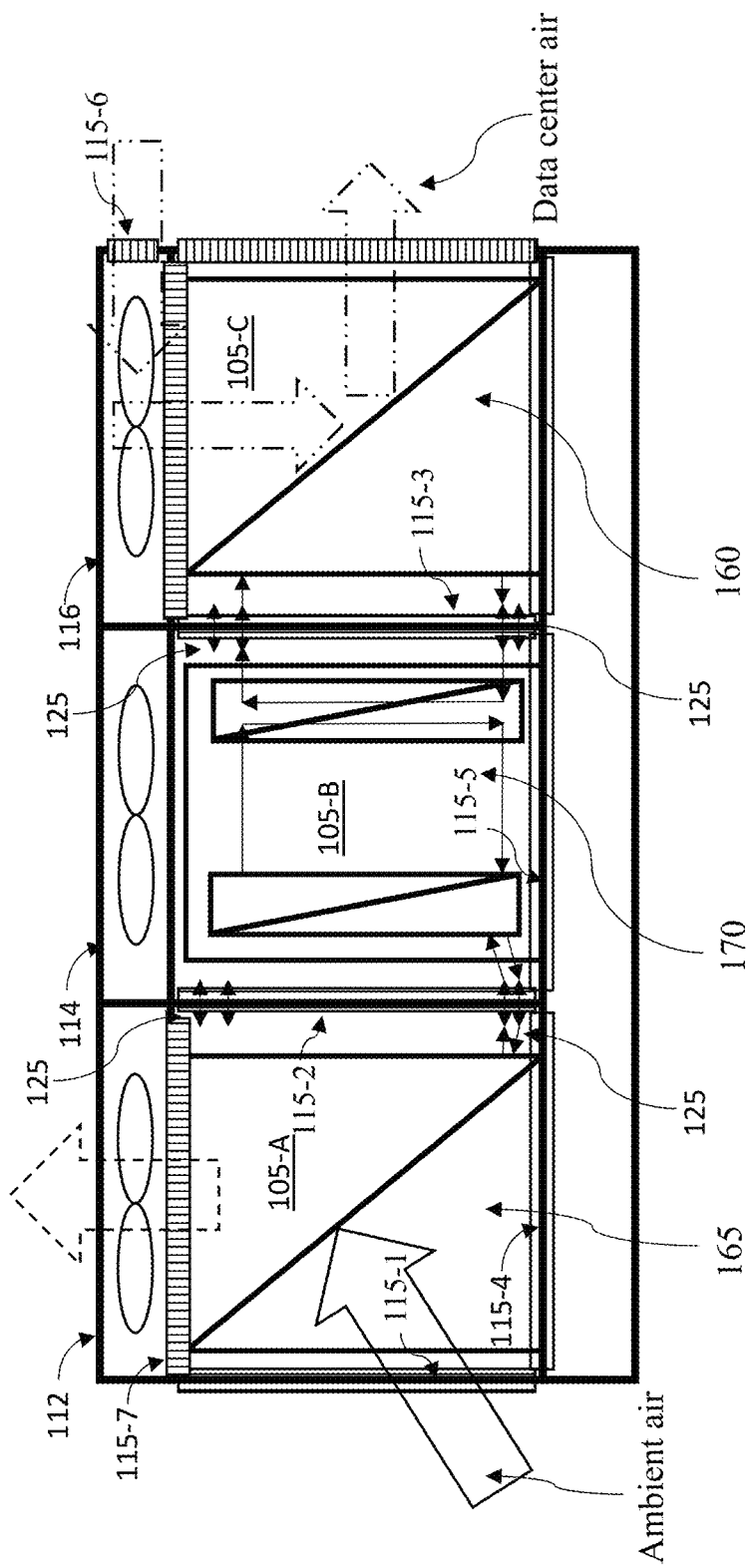
FIG. 5 is a schematic illustrating an example of a computer room air conditioning (CRAC) unit, according to an embodiment.

As a further example, FIG. 5 shows how several modules 100 are arranged to form a traditional multiple loop cooling water and chilled water loop system. In this example, the cooling unit is a CRAC unit 160 as shown in the third core compartment 105-C. The first compartment 105A is a cooling tower 165 or cooling tower equipment having ambient air flowing through the unit by blower 112. That is, ambient air is not introduced into the data center, but only used as heat exchange medium in the cooling tower 165. The second core unit 105-B includes a chiller system 170, which includes condenser, evaporator, expansion valve and compressor. The standard ports of the fluid loops 125 are used for connecting the equipment and transfer fluids among the equipment installed in the three core units 105-A to 105-C. The air from the data center is delivered by the third blower 116 through the CRAC unit 160 and return to the data center. Blower 114 idles and airflow section 120 is inactive. As blower 116 generates a 90° change in air flow direction, a centrifugal or radial blower may be used, which also provides constant air velocity and low-noise operation. In such a case, there is no need for louver 115-6. The various air paths in this embodiment are formed as follows: louvers 115-1, 115-2 and 115-4 are closed, with louver 115-7 (if equipped) open, to form the path for the ambient airflow through the cooling tower 165. Louver 115-3 is closed, thereby confining air moved by blower 116 to flow out to the load.

Figure 6:
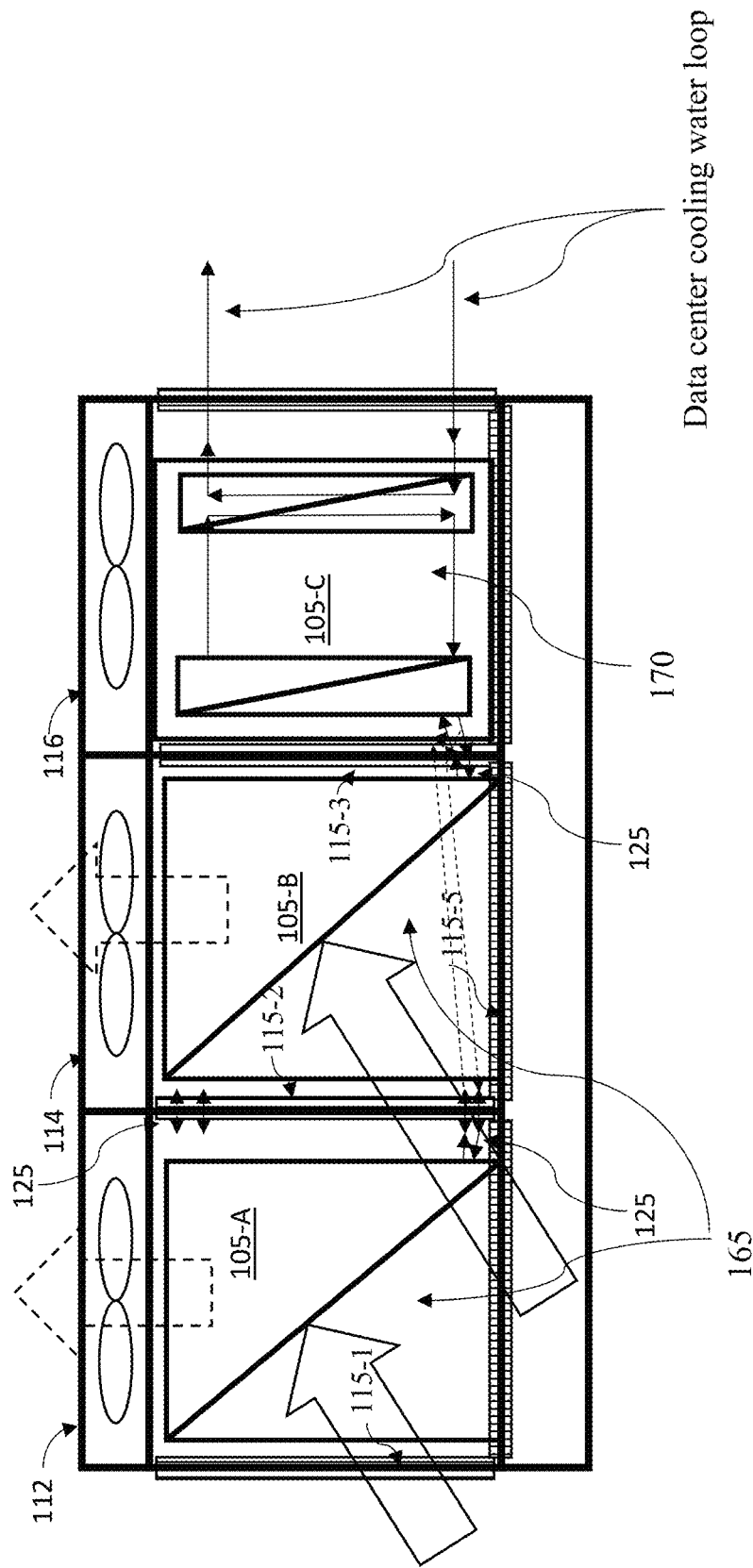
FIG. 6 is a schematic illustrating an example of chiller-based water cooling system, according to an embodiment.

In addition to cooling air, data centers also may use cooling water. The modular system can be configured to deliver cooling water. FIG. 6 shows an example of equipping the system to function as a chilled water loop to delivering chilled water to the load. In this example, the first and second core units, 105-A and 105B, are equipped as two cooling tower units 165. While only one cooling tower may be sufficient, two cooling towers 165 may be provided here either for redundancy or for enhanced cooling purposes. So, while FIG. 6 illustrates both blowers 112 and 114 flowing ambient air through the cooling tower 165, when less cooling is needed only one of the blowers can be operated while the other idles. The ambient air may be supplied to each cooling tower through the side of the core unit, and evacuated via the blower. The chiller loop is installed in core unit 105-C and is coupled to the cooling towers 165 through the standard ports of the fluid loops 125. In the illustration of FIG. 6, the water system for the cooling towers 165 is not shown in the figure.

Figure 7:
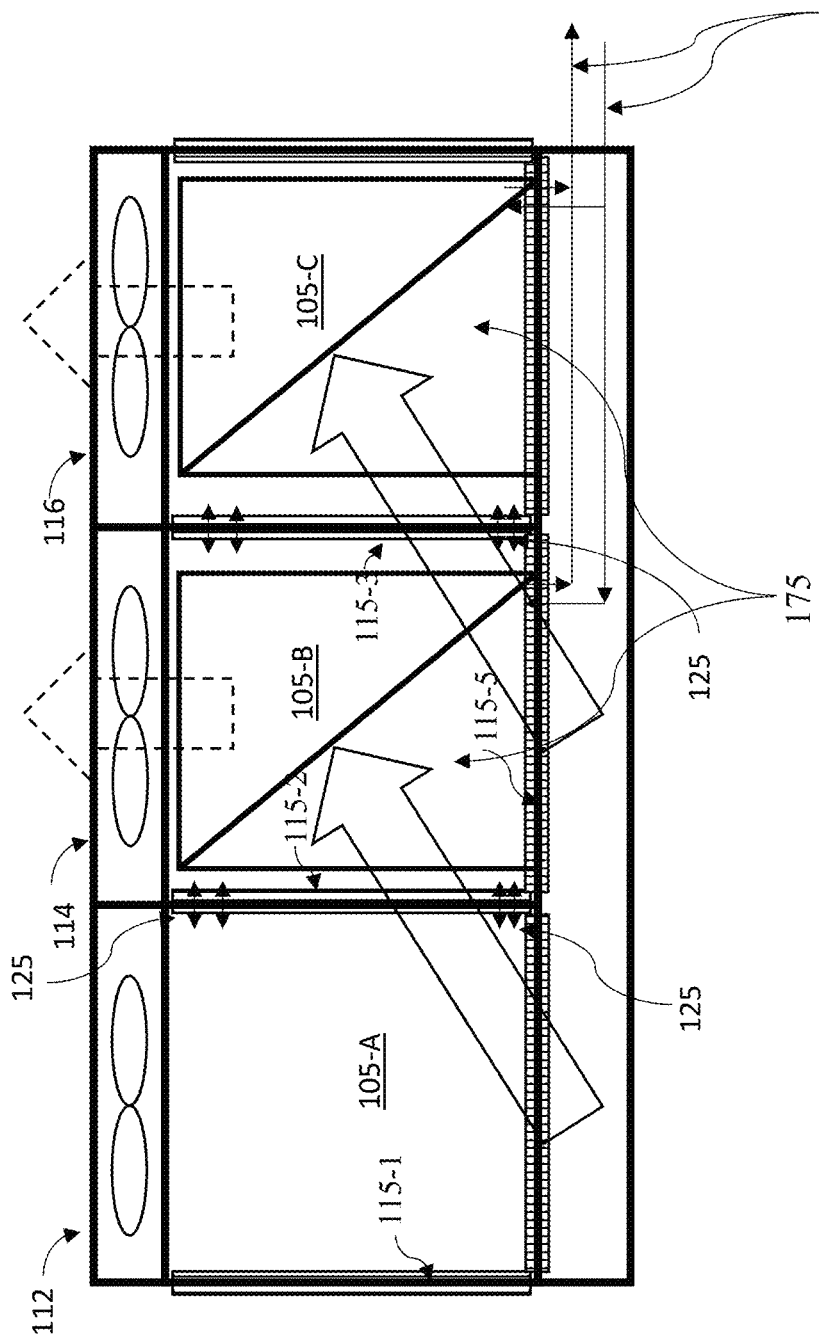
FIG. 7 is a schematic illustrating an example of dry cooler-based water cooling system, according to an embodiment.

Another example of using the modular system to deliver cooling liquid is illustrated in FIG. 7. FIG. 7 illustrates an example of a chiller-less liquid cooling loop. In this example, no equipment is assembled in the first compartment 105-A and blower 112 remains idle. Two dry coolers 175 are installed, one in the second compartment 105-B and one in the third compartment 105-C. Blowers 114 and 116 blow ambient air through these dry coolers 175, thereby removing heat from the cooling water flowing in the fluid cooling loops. The ambient air may be supplied to each dry cooler through the side of the core unit, and evacuated via the blower.

Figure 8:
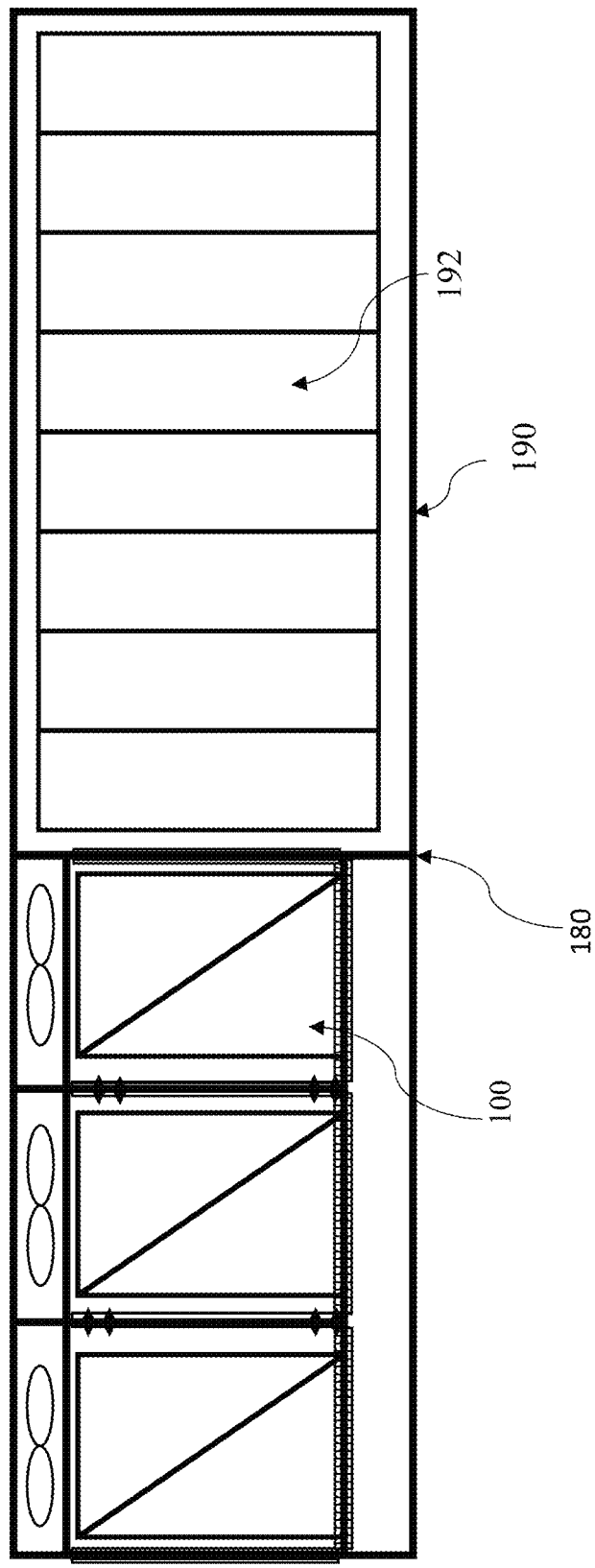
FIG. 8 is a schematic illustrating an example of the modular cooling system attached to an IT module, according to an embodiment.

FIG. 8 illustrates an example of the system design when the cooling module is attached to an IT container 190, having plurality of IT racks 192. Notably, the full system can be assembled from different system integration vendors and tested before it is delivered to the site. Since these are highly productize solutions and designs, the system can be plug and play and start to function quickly. A common and standard interface 180 between the cooling module 100 and IT module 190, enables fast integration of the system and thereby shortens time to operation. The standard interface 180 includes standard fluid connections, air channel, etc.

Figure 9:
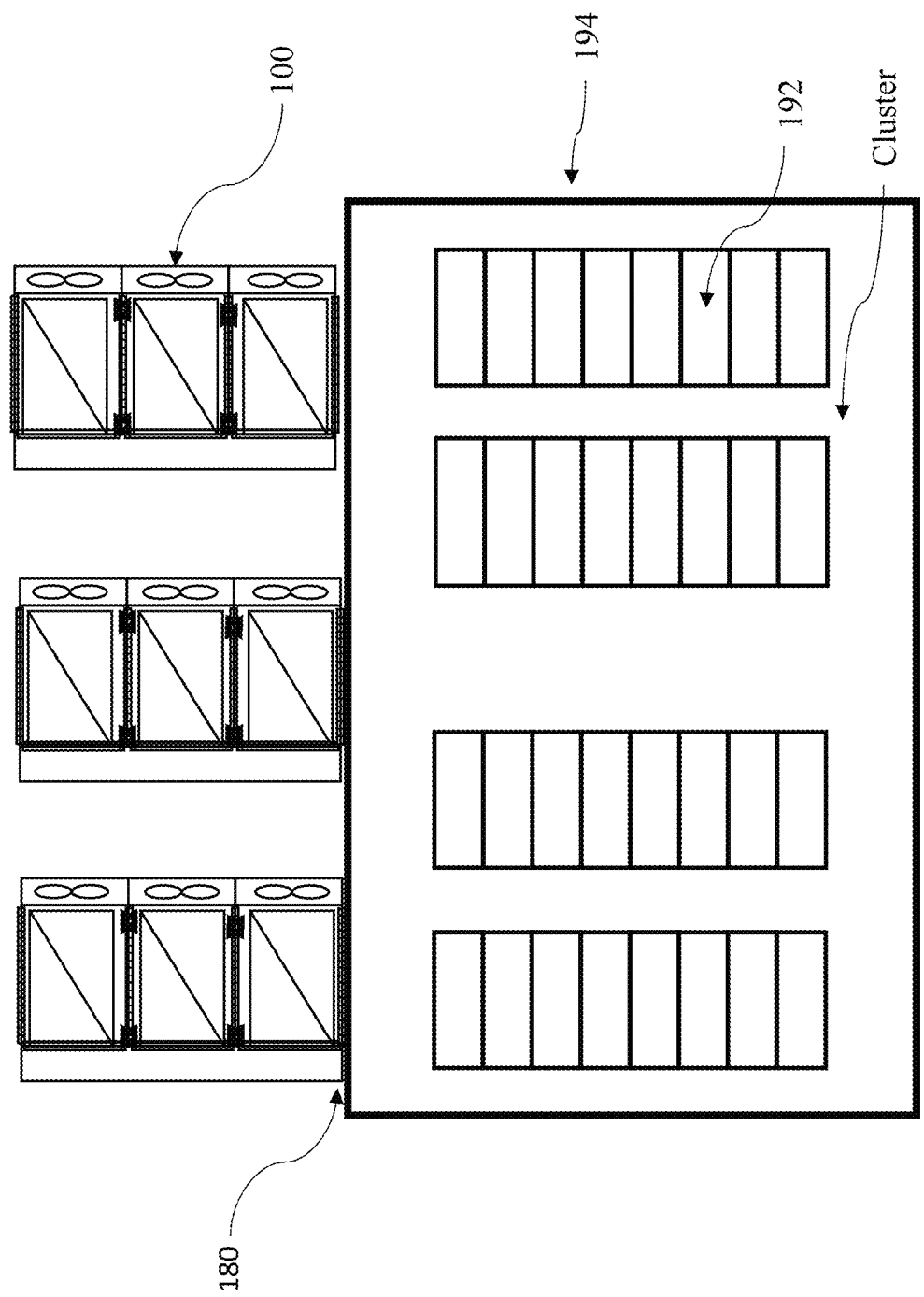
FIG. 9 is a schematic illustrating an example of the modular cooling system attached to a data center building, according to an embodiment.

FIG. 9 shows an example of the cooling system deployed at a data center campus 194. In this example the cooling modules are attached to the building and can deliver cooling air and cooling water into the building to cool racks 192. In this case as well a standard interface 180 can be used for fast integration of the system into the data center building.

Thus, disclosed embodiments provide a modular cooling system comprising a plurality of interconnected modules in a linear fashion, and an airflow section, wherein each of the modules includes a core unit, a blower section, a plurality of dampers, and fluid ports, and wherein any of the core units may be loaded with equipment selected from: air filter, humidifier, dehumidifier, heat exchanger, evaporator, condenser, chiller, CRAC, dry cooler, and a cooling tower.

Figure 10:
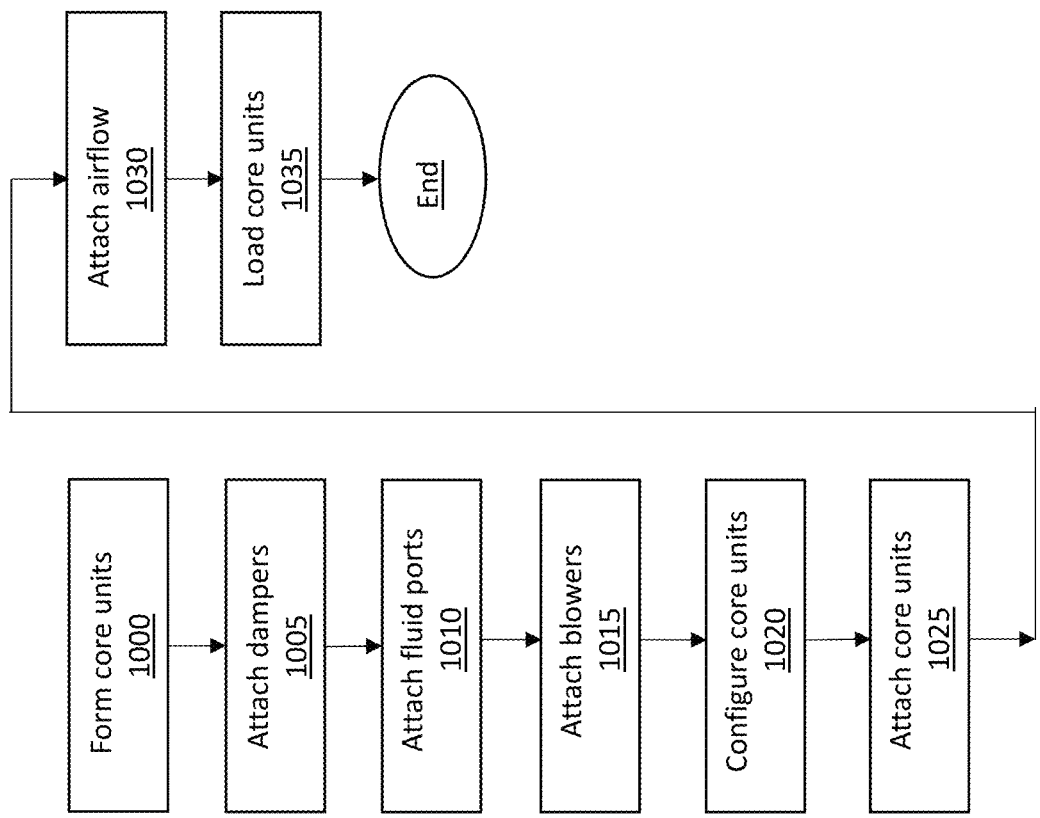
FIG. 10 is a flow chart illustrating a method for assembling and configuration a cooling system of a data center according to an embodiment.

Disclosed embodiments also provide a method for assembling a cooling system of a data center, an example of which is illustrated in FIG. 10; note however, that the order of the operations illustrated in FIG. 10 is but one example and the operations may be executed in different order than illustrated. At block 1000 the process begins by forming a plurality of core units, each of which may have the same dimensions and the same form factor. Conversely, the core units may be formed having form factors that differs among an end unit, a middle unit, and an attachment unit. An end unit has only one side that can be attached to another core unit; a middle core unit has two opposing walls that each may connect to another core unit; and an attachment unit has one wall that can be attached to another core unit and an opposing wall that is configured to attach to an IT structure (IT container, data center, etc.).

In block 1005 the process proceeds by attaching to each core unit a plurality of mechanized air dampers, followed in 1010 by attaching to each core unit a plurality of fluid ports. In block 1015 a blower is attached to each of the core units. In block 1020 the cooling requirements are reviewed to determine the configuration and the number of core units required. In block 1025 the number of core units determined in block 1020 are attached to each other to form a linear assembly and in 1030 an airflow section is attached to the linear assembly. In block 1035 the configuration determined in 1020 is used for loading at least one of the core units with cooling equipment. According to the configuration determined in 1020, the cooling equipment may be selected from, e.g., air filter, humidifier, dehumidifier, heat exchanger, evaporator, condenser, chiller, CRAC, water spray system, dry cooler, a cooling tower and others. The system is then ready for installation.

Note also, that depending on shipment and other requirements, the core units may be assembled and loaded as described, but not attached to each other until they arrive at the installation site. Since the core units include the fluid ports, dampers, blowers, etc., they can be easily attached to each other at the site and be ready for operation.

Figure 11:
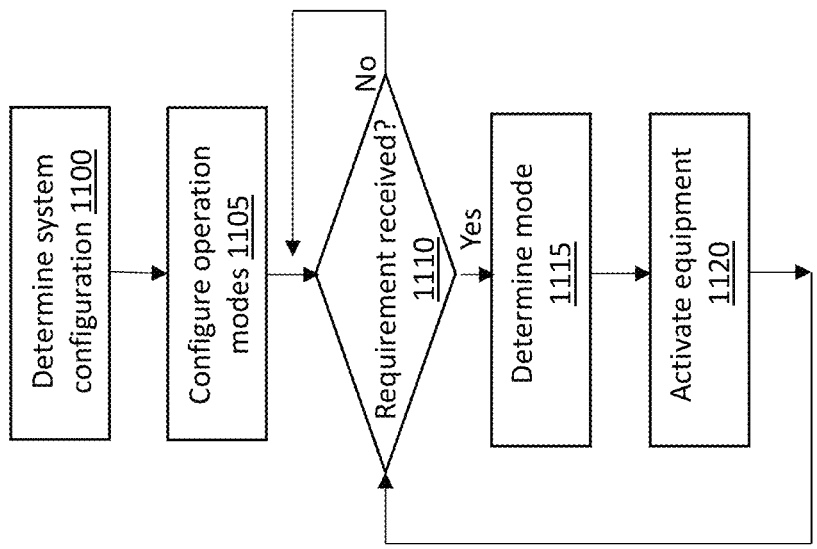
FIG. 11 illustrates a process for operating a cooling system according to disclosed embodiment.

FIG. 11 illustrates a process for operating a cooling system according to disclosed embodiment. The process may be programmed into a controller of the system and executed automatically by the controller. The controller may be a specially designed computing system or a general computer preprogrammed to execute the process. In block 1100 the system configuration is determined. This may include entering the configuration into the controller and may include an identification of the number of core units, the cooling equipment loaded into each core unit, the number and location of dampers, the number and locations of any valves installed on the fluid loops, the number and type of blowers, etc. Based on the system configuration, operating modes are configured. The operation modes may include data regarding the conditions and/or requirements that would trigger each of the operating modes (e.g., outside air temperature and quality, return air temperature, air humidity, etc.). Each operation mode may include the identification of cooling equipment to be activated, blowers to be operated and rotation direction of each operated blower, identity of each louver to be opened and amount of opening, etc. At block 1110 it is determined whether a requirement for cooling has been received. If so, at 1115 the process determines which operational mode is best responsive to the particular requirements received and the prevailing conditions. According to the determination in block 1115, and based on the operation modes configured in block 1105 the appropriate activation signals are sent to the various elements (cooling equipment, blowers, louvers, etc.) relevant to the selected operating modes. The method then continues to monitor whether new cooling requirements have been received, requiring changing of the operating mode. If so, the appropriate operating mode is determined and new activation signals are issued to change the operating mode.

The process may proceed until the system is turned off or the requirement received in block 1110 indicates that no cooling is required.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A modular cooling system for data center, comprising:
   an airflow section forming a duct for air flow;
   a plurality of core units serially attached to each other to form a linear assembly and the linear assembly attached to the airflow section;
   a plurality of blower units, each blower unit attached to one of the core units;
   a plurality of motorized dampers, the plurality of motorized dampers including at least one motorized damper provided between each core unit and the airflow section and at least one motorized damper provided between each pair of serially attached core units;
   a plurality of fluid ports attached to each of the core units; and
   wherein at least one of the core units is loaded with one or more equipment.

2. The modular cooling system of claim 1, wherein the equipment is selected from: an air filter, humidifier, dehumidifier, heat exchanger, evaporator, condenser, chiller, computer room air conditioner (CRAC), dry cooler, water spray system and a cooling tower.

3. The modular cooling system of claim 1, wherein one of the core units is loaded with an air filter and a humidifier/dehumidifier unit.

4. The modular cooling system of claim 1, wherein one of the core units is loaded with a water reservoir and a pump, a second core unit is loaded with an air-to-air heat exchanger and a condenser with a water spray arrangement, and a third core unit is loaded with an evaporator thereby forming an indirect evaporative cooling system.

5. The modular cooling system of claim 4, wherein the water spray arrangement is connected to the pump through the fluid ports.

6. The modular cooling system of claim 1, wherein one of the core units is loaded with a water reservoir and a pump, a second core unit is loaded with an air-to-air heat exchanger with a water spray arrangement, and a third core unit is loaded with an evaporator and a condenser, thereby forming an indirect evaporative cooling system.

7. The modular cooling system of claim 1, wherein a first core unit is loaded with a cooling tower, a second core unit is loaded with a chiller, and a third core unit is loaded with a CRAC unit, thereby forming a CRAC system with a chilled water loop.

8. The modular cooling system of claim 1, wherein a first core unit is loaded with a cooling tower and a second core unit is loaded with a chiller connected to a cooling water loop.

9. The modular cooling system of claim 7, wherein the chiller is connected to the cooling tower through the fluid ports.

10. The modular cooling system of claim 1, wherein at least one core unit is loaded with a dry air cooler and having an ambient air inlet flowing ambient air through the dry air cooler, thereby providing cooling water.

11. A method for assembling a cooling system for data center, comprising:
    attaching a plurality of core units to an airflow section, the airflow section forming a duct for air flow, wherein the plurality of core units are serially attached to each other to form a linear assembly;
    attaching a plurality of blower units, wherein one blower unit is attached to each of the core units;
    attaching a plurality of fluid ports to each of the core units;
    attaching a plurality of motorized dampers, wherein at least one motorized damper is attached between each core unit and the airflow section and at least one motorized damper is attached between each pair of serially attached core units; and
    loading at least one of the core units with equipment.

12. The method of claim 11, wherein the equipment is selected from: an air filter, humidifier, dehumidifier, heat exchanger, evaporator, condenser, chiller, computer room air conditioner (CRAC), dry cooler, water spray system and a cooling tower.

13. The method of claim 11, comprising loading one of the core units with an air filter and a humidifier/dehumidifier unit, thereby forming an ambient air cooling system.

14. The method of claim 11, comprising: loading one of the core units with a water reservoir and a pump, loading a second core unit with an air-to-air heat exchanger and a condenser with a water spray arrangement, and loading a third core unit with an evaporator, thereby forming an indirect evaporative cooling system.

15. The method of claim 14, further comprising connecting the water spray arrangement to the pump through the fluid ports.

16. The method of claim 11, comprising loading one of the core units with a water reservoir and a pump, loading a second core unit with an air-to-air heat exchanger with a water spray arrangement, and loading a third core unit with an evaporator and a condenser, thereby forming an indirect evaporative cooling system.

17. The method of claim 11, comprising loading a first core unit with a cooling tower, loading a second core unit with a chiller, and loading a third core unit with a CRAC unit, thereby forming a CRAC system with a chilled water loop.

18. The method of claim 11, comprising loading a first core unit with a cooling tower and a second core unit with a chiller connected to a cooling water loop.

19. The method of claim 17, comprising connecting the chiller to the cooling tower through the fluid ports.

20. The method of claim 11, further comprising: configuring operation modes, wherein each operation mode includes indication comprising cooling equipment operation, blower operation, and louver operation; selecting an operation mode according to cooling requirements and prevailing conditions; activating cooling equipment, blowers and louvers according to the selected operation mode; and, monitoring cooling requirements and prevailing conditions to determine whether to change the selected operation mode and, if a change in the selected operation mode is determined, activating cooling equipment, blowers and louvers according to a newly selected operation mode.

* * * * *